United States Patent
Kim

(10) Patent No.: US 7,221,618 B2
(45) Date of Patent: May 22, 2007

(54) SEMICONDUCTOR MEMORY DEVICE HAVING DIFFERENT SYNCHRONIZING TIMINGS DEPENDING ON THE VALUE OF CAS LATENCY

(75) Inventor: Min-soo Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/520,385

(22) Filed: Sep. 13, 2006

(65) Prior Publication Data

US 2007/0008809 A1 Jan. 11, 2007

Related U.S. Application Data

(62) Division of application No. 10/899,369, filed on Jul. 26, 2004, now Pat. No. 7,130,241.

(30) Foreign Application Priority Data

Oct. 22, 2003 (KR) .............................. 2003-73824

(51) Int. Cl.
*G11C 8/00* (2006.01)
(52) U.S. Cl. .................... 365/233; 365/233.5; 365/193
(58) Field of Classification Search ................ 365/233, 365/233.5, 193
See application file for complete search history.

(56) References Cited

U.S. PATENT DOCUMENTS

| 5,517,462 | A | * | 5/1996 | Iwamoto et al. ............ 365/233 |
| 6,125,078 | A | * | 9/2000 | Ooishi et al. ............... 365/233 |
| 6,260,128 | B1 | * | 7/2001 | Ohshima et al. ............ 711/169 |
| 6,404,697 | B1 | | 6/2002 | Ryu et al. .............. 365/230.04 |
| 6,427,197 | B1 | * | 7/2002 | Sato et al. .................. 711/169 |
| 6,438,066 | B1 | * | 8/2002 | Ooishi et al. ............... 365/233 |
| 6,552,955 | B1 | | 4/2003 | Miki ......................... 365/233 |
| 6,724,686 | B2 | * | 4/2004 | Ooishi et al. ............... 365/233 |
| 6,813,696 | B2 | | 11/2004 | Kanda et al. ............... 711/167 |

FOREIGN PATENT DOCUMENTS

KR  2001-0035850  5/2001

* cited by examiner

*Primary Examiner*—Tuan T. Nguyen
(74) *Attorney, Agent, or Firm*—Mills & Onello LLP

(57) ABSTRACT

A semiconductor memory device including a clock buffer, a column selection line decoder, a control signal generation circuit, and a column selection line driver is provided. The clock buffer receives an external clock signal and information about a column address strobe (CAS) latency and generates either a first clock signal which synchronizes with rising edges of the external clock signal or a second clock signal which synchronizes with falling edges of the external clock signal depending on the type of CAS latency information. The column selection line decoder receives and decodes a column selection address and outputs a decoding address used to select either a column selection line signal synchronized with the first or second clock signal. The control signal generation circuit outputs control signals that synchronize with one of the first and second clock signals. The column selection line driver drives the column selection line signal in synchronization with one of the first and second clock signal in response to the decoding address and the control signals.

5 Claims, 6 Drawing Sheets

SEMICONDUCTOR MEMORY DEVICE HAVING DIFFERENT SYNCHRONIZING TIMINGS DEPENDING ON THE VALUE OF CAS LATENCY

RELATED APPLICATIONS

This application is a divisional of U.S. application Ser. No. 10/899,369, filed on Jul. 26, 2004, now U.S. Pat. No. 7,130,241 which relies for priority upon Korean Patent Application No. 10-2003-0073824, filed on Oct. 22, 2003, the contents of which are herein incorporated by reference in their entirety.

BACKGROUND OF THE INVENTION

1. Field of the Invention

The present invention relates to a semiconductor memory device, and more particularly, to a semiconductor memory device having different synchronizing timings depending on a column address strobe (CAS) latency (hereinafter, referred to as a CL).

2. Description of the Related Art

As the operating frequency of a semiconductor memory system gradually increases, the performance of a semiconductor memory increases. Semiconductor memories are developed to have high frequency bandwidths. Synchronous DRAMs (SDRAMs) are synchronous semiconductor memories manufactured using a pipelining technique. SDRAMs are classified as single data rate (SDR) SDRAMs or double data rate (DDR) SDRAMs. An SDR SDRAM controls an output data buffer to be enabled/disabled in synchronization with the rising edge of every clock, that is, in synchronization with every clock cycle. A DDR SDRAM controls an output data buffer to be enabled/disabled in synchronization with every rising edge and every falling edge of a clock, that is, in synchronization with every half a clock cycle.

Hence, in an SDR SDRAM, a column address strobe (CAS) latency (hereinafter, referred to as a CL), which represents the reaction interval between the time when a column address is input to the memory until the time when data is output from the memory, must vary in units of one clock cycle, such as, CL=1, CL=2, CL=3, and the like. On the other hand, in a DDR SDRAM, the CL must vary in units of half a clock cycle, such as, CL=2, CL=2.5, CL=3, and the like. Accordingly, a DDR SDRAM requires a higher frequency bandwidth and a greater timing margin than those required by an SDR SDRAM.

FIG. 1 is a timing diagram of signals when data is read from a conventional DDR SDRAM. Referring to FIG. 1, outputting of data from the memory cells of a page selected by a row active operation is based on a column selection line signal CSL. The column selection line signal CSL is produced once during a cycle of an external clock signal EXTCLK. When a data read command READ is received after an external active command ACTIVE, the column selection line signal CSL is produced in synchronization with a rising edge of the external clock signal EXTCLK. When the CL is 2, data is read out in synchronization with a rising edge of the external clock signal EXTCLK that is two clock cycles after the data read command READ has been input. When the CL is 2.5, data is read out in synchronization with a falling edge of the external clock signal EXTCLK that is 2.5 cycles after the data read command READ has been received. When the CL is 3, data is read out in synchronization with a rising edge of the external clock signal EXTCLK that is three cycles after the data read command READ has been received.

Time between the timing of a rising edge of the external clock signal EXTCLK at which the data read command READ is received and the timing of readout of first data DQ0 is referred to as tAA. Also, tRCD (where RCD is an abbreviation of RAS-to-CAS Delay) denotes time corresponding to several clocks delayed until a CAS command is received after a reception of a row address strobe (RAS) command. In FIG. 1, tRCD is the time interval from when the external active command ACTIVE is received to when the data read command READ is received. The RAS command is a command to activate a specific page within a memory. Only after the page is activated, a CAS command is received so that data can be input to and/or output from the memory. A page denotes a specific address block within a memory.

FIG. 2 is a timing diagram of signals when a conventional DDR SDRAM is controlled in a CSL controlling approach. Referring to FIG. 2, the conventional DDR SDRAM is designed so that a column selection line signal CSL is controlled in response to rising edges of a clock signal. Both when a CL is 2.5 and when the CL is 3, the column selection line signal CSL is controlled in synchronization with a rising edge 200 of the external clock signal EXCLK. That is, in both cases, the column selection line signal CSL is enabled or disabled at an identical timing.

A first pulse of a first read pulse signal FRP, which is generated to initially read cell data, is produced in synchronization with a rising edge 210, which is one clock behind a rising edge at which a read command READ is received. A second pulse of the first read pulse signal FRP is produced in synchronization with a rising edge 220, which is one clock behind the rising edge 210. Since the pulses of the signal FRP are produced in response to a CSL signal, the timing of the signal FRP when the CL is 2.5 is identical to that when the CL is 3.

On the other hand, the pulses of a second read pulse signal SRP are produced at different timings depending on the value of a CL. When the CL is 2.5, a first pulse of the signal SRP is produced in response to a falling edge 230, which is one clock and a half after the receipt of the read command READ, and a second pulse is produced in response to a falling edge 240, which is one clock after the clock falling edge 230. When the CL is 3, a first pulse of the signal SRP is produced in response to a rising edge 250, which is 2 clocks after the receipt of the read command READ, and a second pulse is produced in response to a rising edge of the signal EXTCLK which is one clock after the rising edge 250. Consequently, a difference between the pulse timing of the signal SRP where CL=2.5 and that where CL=3 is half a clock.

Since the CSL signal is controlled in response to the clock rising edge 200 both when the CL is 2.5 and when the CL is 3, tAA margins within a memory when the CL is 3 are the same as those when the CL is 2.5. Consequently, the conventional DDR SDRAM is designed so that there is no big difference in a tAA margin controlling way between when the CL is 2.5 and when the CL is 3. That is, there is no difference in the pulse timing of the signal CSL or FRP, which determines a read tAA performance, between when the CL is 2.5 and when the CL is 3. There is only a difference of half a clock between the pulse timing of the signal SRP when the CL is 2.5 and that when the CL is 3. Hence, a difference in tRCD, which is a core parameter, between the two cases of CL=2.5 and CL=3 is hardly expected. A gain that can be obtained when the CL is 3 cannot be considered extremely greater than that when the CL is 2.5. That is, a path along which tRCD is determined when the CL is 2.5 is identical to the path when the CL is 3.

The conventional DDR SDRAM is also designed so that when the CL is 3, a first pulse of the signal SRP and a second pulse of the signal FRP are produced at an identical clock (which is indicated by both reference numerals 220 and 250). However, in the conventional DDR SDRAM designed as describe above, if the waveform of the signal SRP is deformed due to a severe jitter of an internal delay locked loop (DLL), the falling edge of the first pulse of the signal SRP moves into the second pulse of the signal FRP. Thus, the conventional DDR SDRAM may fail to operate.

FIG. 3 is a timing diagram of signals when a DLL of the conventional DDR SDRAM jitters. Referring to FIG. 3, when the CL is 3, the rising edge of a second pulse of the signal FRP is earlier than the falling edge of a first pulse of the signal SRP. In this case, an error may be generated during data reading or the like, resulting in a malfunction of the conventional DDR SDRAM. This problem may be generated when the FRP and SRP signals have insufficient pulse-timing margin, since the signal FRP is controlled in response to the external clock signal EXTCLK and the signal SRP is controlled by the internal DLL. Also, as a semiconductor memory is being developed so as to operate within a high frequency range, the interval between clocks becomes narrow. In this case, a timing margin between pulses of the signals SRP and FRP when CL=3 becomes important.

SUMMARY OF THE INVENTION

The present invention provides a semiconductor memory device capable of further increasing a margin tRCD when a CAS latency (CL) is 3 than when the CL is 2.5 while using a conventional method to design a margin tAA.

The present invention also provides a semiconductor memory device designed so that a column selection line signal and first and second read pulse signals are controlled in synchronization with the clocks of an external clock signal when the CL is 3 independently of when the CL is 2.5.

The present invention further provides a semiconductor memory device capable of securing a margin between the second read pulse signal, which is controlled by a delay locked loop (DLL), and the first read pulse signal, which is controlled in synchronization with the external clock signal by setting half a clock difference the interval between a pulse of the second read pulse signal and a pulse next to the pulse of the first read pulse signal corresponding to the pulse of the second read pulse signal.

According to an aspect of the present invention, there is provided a semiconductor memory device comprising: a clock buffer receiving an external clock signal and information about a column address strobe (CAS) latency and generating either a first clock signal which synchronizes with rising edges of the external clock signal or a second clock signal which synchronizes with falling edges of the external clock signal depending on the type of CAS latency information; a column selection line decoder receiving and decoding a column selection address and outputting a decoding address used to select either a column selection line signal synchronized with the first or second clock signal; a control signal generation circuit outputting control signals that synchronize with one of the first and second clock signals; and a column selection line driver driving the column selection line signal in synchronization with one of the first and second clock signal in response to the decoding address and the control signals.

When the received CAS latency information is CL=2 or CL=2.5, the clock buffer may generate the first clock signal. When the received CAS latency information is CL=3, the clock buffer may generate the second clock signal. In one embodiment, the control signals are a pulse signal for enabling the column selection line signal and a pulse signal for disabling the column selection line signal. The semiconductor memory device may further comprise a first read pulse generation circuit which receives one of the first and second clock signals, generates a first read pulse signal that is enabled in synchronization with the first clock signal when the first clock signal is received, and generates a first read pulse signal that is enabled in synchronization with the second clock signal when the second clock signal is received.

The semiconductor memory device may further comprise an input/output sense amplifier which is controlled in synchronization with the rising or falling edges of the external clock signal.

The semiconductor memory device may further comprise a second read pulse generation circuit. When the CAS latency is 2.5, the second read pulse generation circuit generates a second read pulse signal that is enabled in synchronization with a falling edge of the external clock signal that is 2.5 clock cycles behind a rising edge at which a read command is input. When the CAS latency is 3, the second-read pulse generation circuit generates a second read pulse signal that is enabled in synchronization with a rising edge of the external clock signal that is 3 cycles behind the rising edge at which the read command is input.

According to another aspect of the present invention, there is provided a semiconductor memory device comprising a clock buffer and a first read pulse generation circuit. The clock buffer receives an external clock signal and information about a column address strobe (CAS) latency and generates either a first clock signal which synchronizes with rising edges of the external clock signal or a second clock signal which synchronizes with falling edges of the external clock signal depending on the type of CAS latency information. The first read pulse generation circuit receives one of the first and second clock signals, generates a first read pulse signal that is enabled in synchronization with the first clock signal when the first clock signal is received, and generates a first read pulse signal that is enabled in synchronization with the second clock signal when the second clock signal is received.

The semiconductor memory device can further include: a column selection line decoder receiving and decoding a column selection address and outputting a decoding address used to select either a column selection line signal synchronized with the first or second clock signal; and a column selection line driver driving the column selection line signal in response to one of the first and second clock signal and the decoding address.

The semiconductor memory device can further include a control signal generation circuit outputting control signals that synchronize with one of the first and second clock signals, wherein the column selection line driver drives the column selection line signal in response to the control signals.

In one embodiment, when the received CAS latency information is CL=2 or CL=2.5, the clock buffer generates the first clock signal; and when the received CAS latency information is CL=3, the clock buffer generates the second clock signal. When the CAS latency is 2.5, a second read pulse signal is enabled in synchronization with a falling edge of the external clock signal that is 2.5 clock cycles behind a rising edge at which a read command is input; and when the CAS latency is 3, a second read pulse signal is enabled in synchronization with a rising edge of the external clock signal that is 3 clock cycles behind the rising edge at which the read command is input.

In accordance with another aspect, the invention is directed to a method of controlling timing of a semiconductor memory device, the method comprising: receiving an external clock signal and information about a column address strobe (CAS) latency; and controlling a column selection line signal for controlling a column selection line in synchronization with one of rising and falling edges of the external clock signal depending on the type of CAS latency information.

In one embodiment, the method further includes outputting a first read pulse signal which synchronizes with one of a rising edge and a falling edge of the external clock signal depending on the type of CAS latency information. In one embodiment, the controlling of the column selection line signal comprises: outputting one of a first clock signal which synchronizes with rising edges of the external clock signal and a second clock signal which synchronizes with falling edges of the external clock signal depending on the type of CAS latency information; and controlling the column selection line signal in response to the first and/or second clock signals. Controlling the column selection line signal can include: outputting one of a first clock signal which synchronizes with rising edges of the external clock signal and a second clock signal which synchronizes with falling edges of the external clock signal depending on the type of CAS latency information; and controlling a first read pulse signal in response to the first and/or second clock signals.

In one embodiment, first and second edges of the external clock signal have a phase difference of half a clock cycle.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
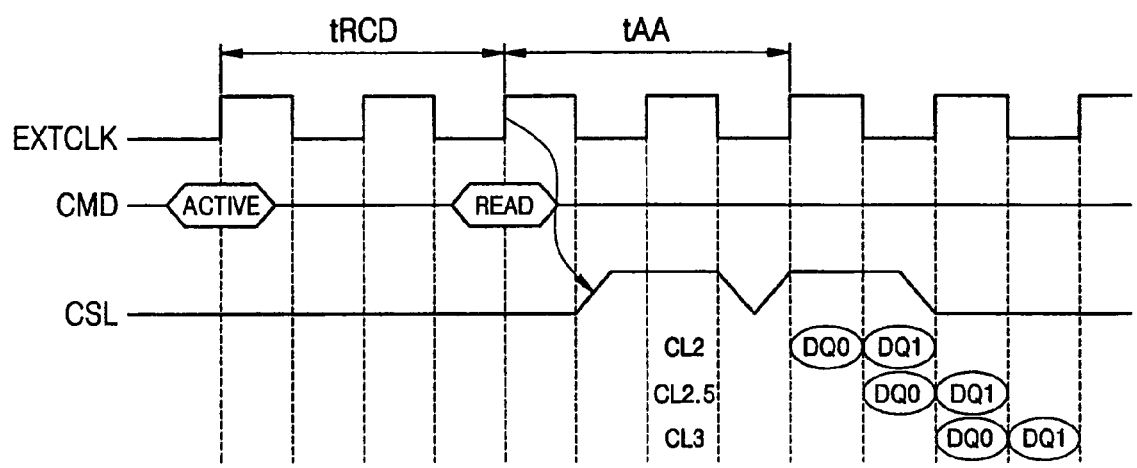
FIG. 1 is a timing diagram of signals when data is read from a general DDR SDRAM.

Hereinafter, the present invention will be described in detail by explaining preferred embodiments of the invention with reference to the attached drawings. Like reference numerals in the drawings denote like elements.

Figure 4:
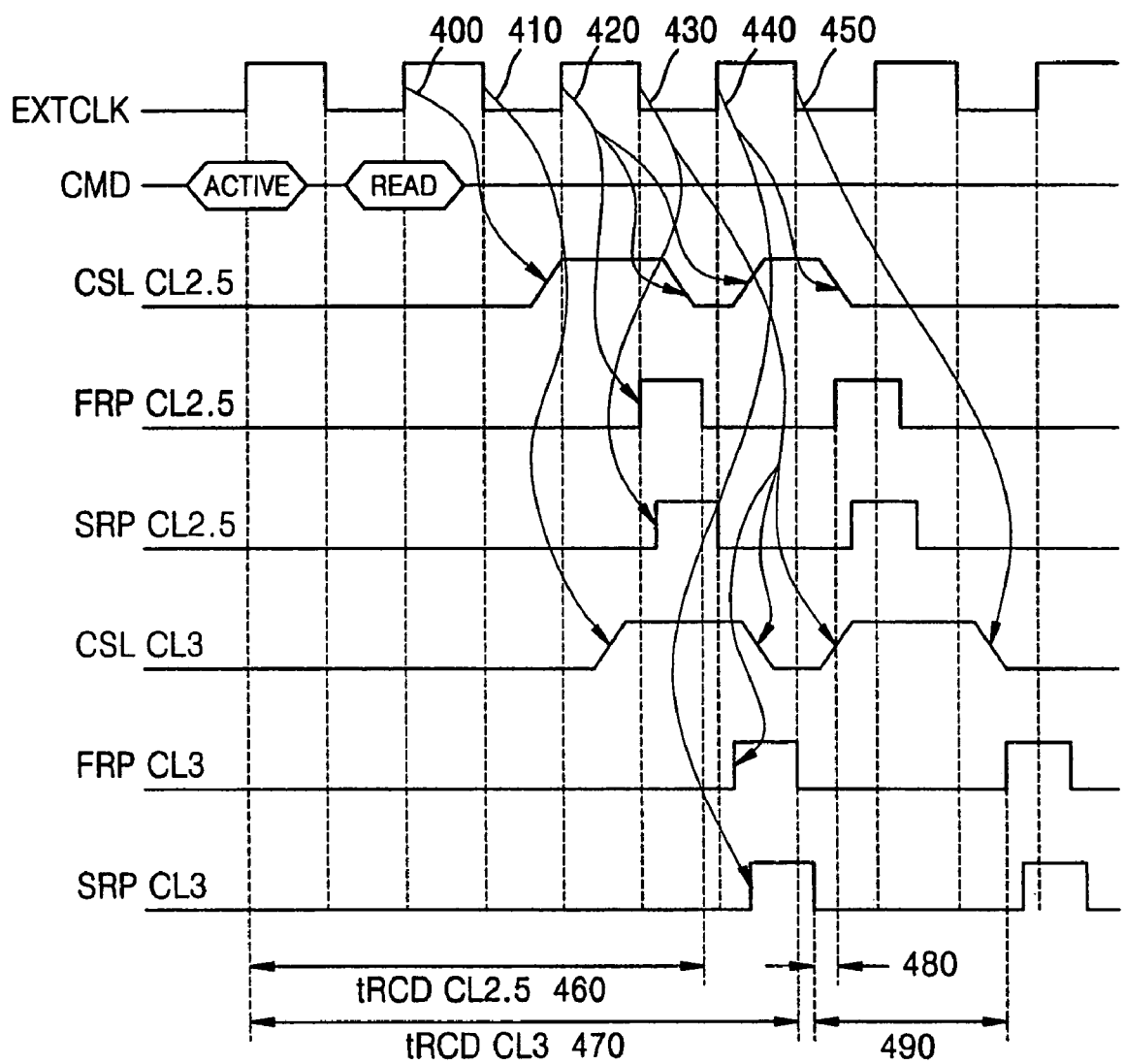
FIG. 4 is a timing diagram of signals in a DDR SDRAM according to an embodiment of the present invention.

FIG. 4 is a timing diagram of signals in a DDR SDRAM according to an embodiment of the present invention. Referring to FIG. 4, similar to the CSL control of a conventional SDRAM, when a column address strobe (CAS) latency (hereinafter, referred to as a CL) is 2.5, a column selection line signal CSL is controlled in synchronization with a rising edge 400 of a clock at which a read command READ is received. This also applies to the situation in which the CL is 2. Hence, the DDR SDRAM of FIG. 4 is designed so that tRCD and tAA are determined in the same way as in the conventional SDRAM.

The DDR SDRAM of FIG. 4 is also designed so that, when the CL is 3, the signal CSL is controlled in synchronization with a falling edge 410 of the clock at which the read command READ is received. That is, when the CL is 3, the CSL and a signal FRP are produced in synchronization with falling edges of the clock at which the read command READ is received, without using the same path as in the conventional SDRAM when the CL is 2 or 2.5.

Hence, when the CL is 2.5, the signal CSL is enabled in response to the rising edge 400 of the clock at which the read command READ is received, and then disabled in response to a rising edge 420 of a next clock. In response to the rising edge 420, the signal CSL is re-enabled, and a first pulse of the signal FRP. In synchronization with a rising edge 440, which is one clock behind the rising edge 420, the signal CSL is re-disabled, and a second pulse of the signal FRP is produced.

When the CL is 3, the signal CSL is enabled in response to the rising edge 410 and disabled in response to a falling edge 430 of the clock next to the clock at which the read command READ is received. In response to the falling edge 430, the CSL signal is re-enabled, and a first pulse of the signal FRP is produced. In response to a falling edge 450, which is one clock behind the falling edge 430, the signal CSL is re-disabled, and a second pulse of the signal FRP is produced.

Since the rising edge 400 and the falling edge 410 have a difference of half a clock, the signals CSL when the CL is 2.5 and when the CL is 3 have a difference of half a clock. Similarly, the signals FRP when the CL is 2.5 and when the CL is 3 have a difference of half a clock. Consequently, the signals CSL and FRP when the CL is 3 are half a clock later than those when the CL is 2.5.

Figure 2:
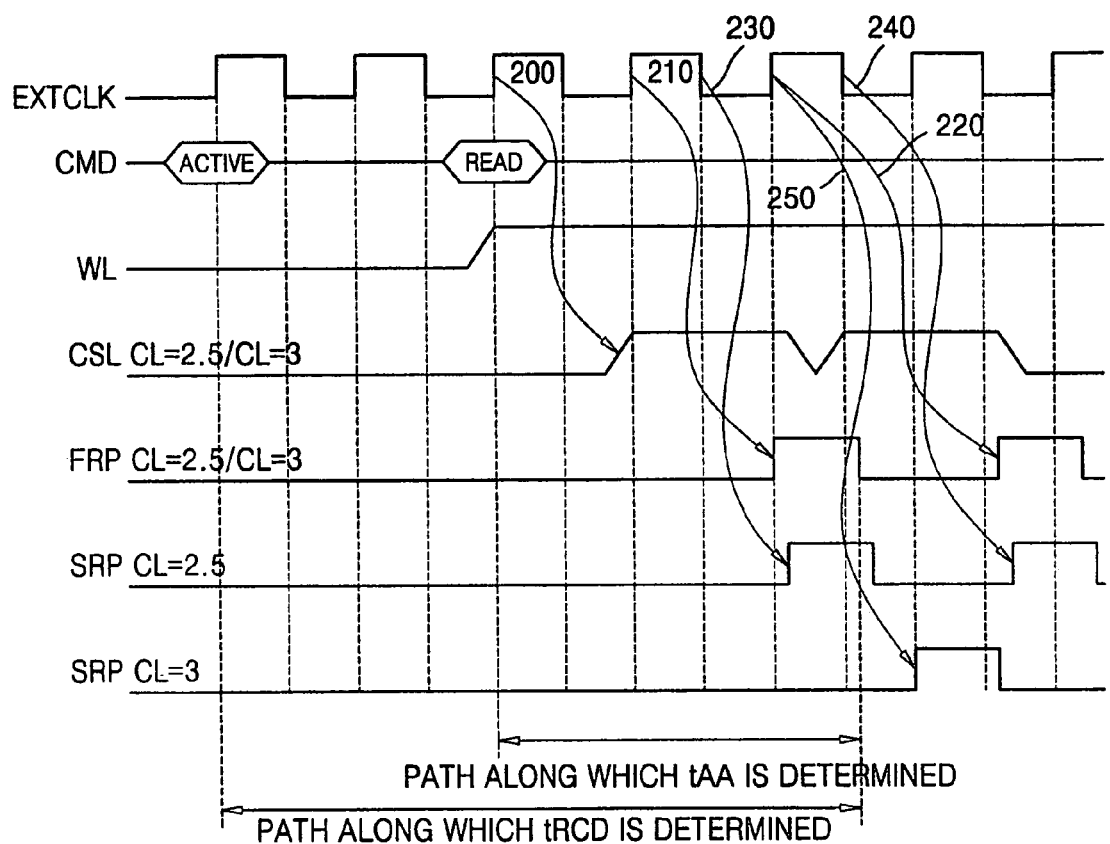
FIG. 2 is a timing diagram of signals when a conventional DDR SDRAM is controlled in a CSL controlling approach.
Figure 3:
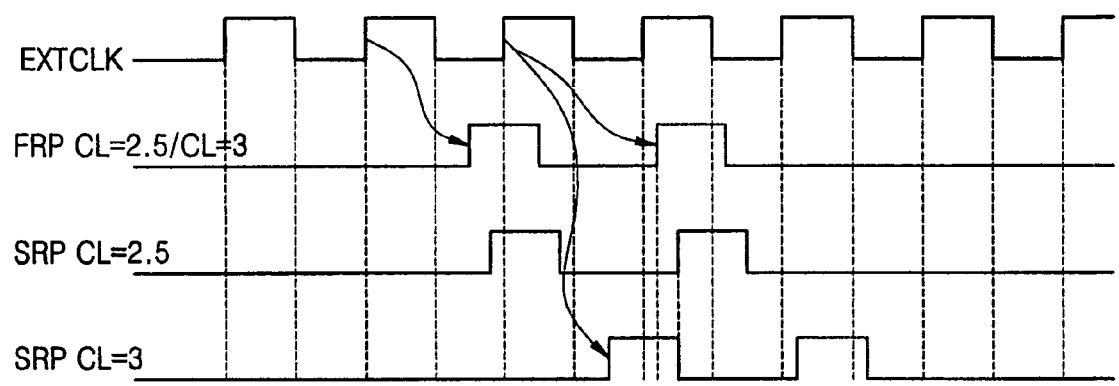
FIG. 3 is a timing diagram of signals when a DLL in a conventional DDR SDRAM jitters.

Since the signal SRP is controlled by an internal DLL instead of in response to an external clock signal, the timing of the signal SRP of FIG. 4 is the same as that of FIG. 2. That is, when the CL is 2.5, a first pulse of the signal SRP is produced in synchronization with the falling edge 430, which is one clock cycle and a half behind the rising edge at which the read command READ is received. When the CL is 3, a second pulse of the signal SRP is produced in synchronization with the rising edge 440, which is two clock cycles behind the rising edge at which the read command READ is received.

Data reading is performed at the timing of the falling edge of each pulse of the signal FRP. As shown in FIG. 4, since the pulses of the signal FRP when the CL is 3 are produced half a clock later than those when the CL is 2.5, a tRCD when the CL is 3 (which is indicated by reference numeral 470) is half a clock longer than a tRCD when the CL is 2.5 (which is indicated by reference numeral 460).

Referring to FIG. 4, a synchronizing edge when the CL is 3 is controlled separately from that when the CL is 2.5. Hence, the signal CSL and the signals FRP and SRP when the CL is 3 can be controlled separately from those when the CL is 2.5.

In a conventional CSL control method, the difference between the SRP timings when the CL is 2.5 and when the CL is 3 is a half clock, but the FRP timing when the CL is 2.5 is the same as that when the CL is 3. Hence, when the CL is 3, margin between the falling edge of a pulse of the signal SRP and the rising edge of a pulse of the signal FRP that is next to the pulse of the signal SRP is the same as a margin 480 (shown in FIG. 4) between the falling edge of a pulse of the signal SRP when CL=3 and the rising edge of a pulse of the signal FRP when CL=2.5 that is next to the pulse of the signal SRP.

However, in a CSL control method according to an embodiment of the present invention, since the difference between the FRP timing when the CL is 3 and that when the CL is 2.5 is about half a clock. Hence, when the CL is 3, a margin between the falling edge of a pulse of the signal SRP and the rising edge of a pulse of the signal FRP that is next to the pulse of the signal SRP is a margin 490 of FIG. 4. Accordingly, even if the signal SRP is deformed due to a severe jitter of the DDL within the DDR SDRAM, a malfunction of the DDR SDRAM due to movement of the falling edge of a first pulse of the signal SRP to a timing earlier than a second pulse of the signal FRP is prevented since a sufficient margin is formed between the pulse timings of the signals FRP and SRP.

Figure 5:
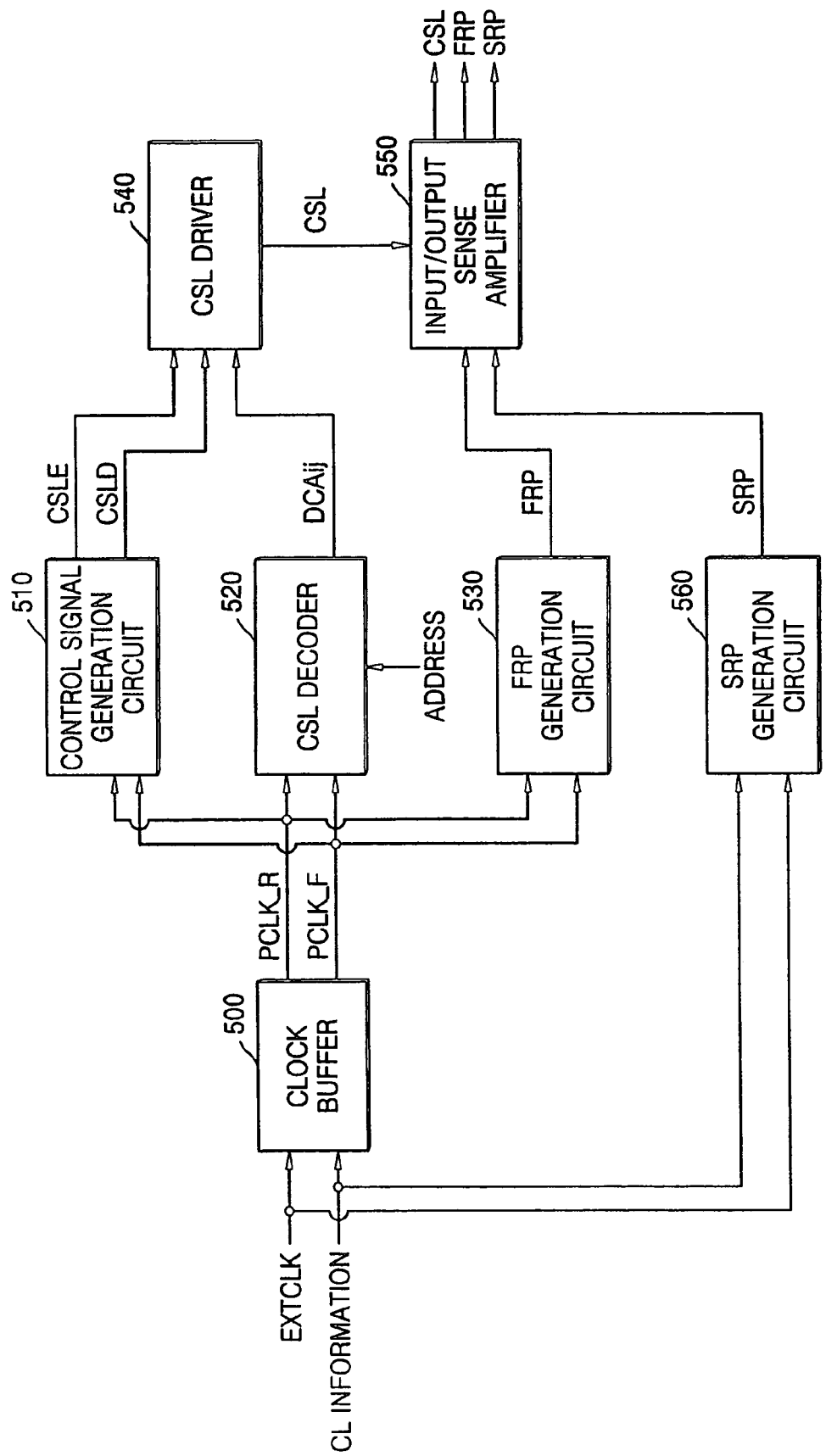
FIG. 5 is a block diagram of a signal generation circuit for implementing a signal controlling method according to an embodiment of the present invention.

FIG. 5 is a block diagram of a signal generation circuit for implementing a signal controlling method according to an embodiment of the present invention. Referring to FIG. 5, the circuit generation circuit includes a clock buffer 500, a control signal generation circuit 510, a CSL decoder 520, an FRP generation circuit 530, a CSL driver 540, an input/output sense amplifier 550, and a SRP generation circuit 560.

The clock buffer 500 receives CL information, examples of which may include CL=2, CL=2.5, and CL=3. A CL may vary with an increase in the speed of a DDR SDRAM. The clock buffer 500 determines whether to use information of CL=2, information of CL=2.5, or information of CL=3 in response to a command issued by a mode register set (MRS) device of a memory. When information of CL=2 and information of CL=2.5 are received, the clock buffer 500 generates a first clock signal PCLK_R, which synchronizes with rising edges of an external clock signal EXTCLK. When information of CL=3 is received, the clock buffer 500 generates a second clock signal PCLK_F, which synchronizes with falling edges of the external clock signal EXTCLK.

The control signal generation circuit 510 receives the first and second clock signals PCLK_R and PCLK_F from the clock buffer 500 and produces a CSL enabling signal CSLE or a CSL disabling signal CSLD. When the CL is 2.5, the control signal generation circuit 510 produces a CSL enabling signal CSLE and a CSL disabling signal CSLD that are synchronized with the first clock signal PCLK_R. When the CL is 3, the control signal generation circuit 510 produces a CSL enabling signal CSLE and a CSL disabling signal CSLD that are synchronized with the second clock signal PCLK_F.

When the CL is 2.5, the CSL decoder 520 controls an address applied in response to a read command READ so that the address is synchronized with the first clock signal PCLK_R, which synchronizes with the rising edges of the external clock signal EXTCLK. When the CL is 3, the CSL decoder 520 controls the address to be synchronized with the second clock signal PCLK_F. Also, when the CL is 3, the CSL decoder 520 produces a decoding address DCAij, which is synchronized with the second clock signal PCLK_F, and outputs the same to the CSL driver 540. In corporation with the CSL enabling pulse signal CSLE and the CSL disabling pulse signal CSLD, the decoding address DCAij is used to control a column selection line signal CSL to be enabled or disabled.

When the CL is 2.5, the FRP generation circuit 530 receives the first clock signal PCLK_R from the clock buffer 500 and produces a first read pulse signal FRP which is synchronized with the first clock signal PCLK_R. When the CL is 3, the FRP generation circuit 530 receives the second clock signal PCLK_R from the clock buffer 500 and produces a first read pulse signal FRP which is synchronized with the second clock signal PCLK_F.

The CSL driver 540 receives the CSL enabling pulse signal CSLE or the CSL disabling pulse signal CSLD from the control signal generation circuit 510 and the decoding address DCAij from the CSL decoder 520. When the CL is 2.5, the CSL driver 540 enables a column selection line signal CSL which is synchronized with a rising edge of a clock, using the decoding address DCAij and the CSL enabling pulse signal CSLE that is generated in synchronization with the first clock signal PCLK_R.

When the CL is 3, the CSL driver 540 enables a column selection line signal CSL which is synchronized with a falling edge of a clock, using the decoding address DCAij and the CSL enabling pulse signal CSLE that is generated in synchronization with the second clock signal PCLK_F. Also, when receiving the CSL disabling pulse signal CSLD from the control signal generation circuit 510, the CSL driver 540 controls the CSL to be disabled.

The input/output sense amplifier 550 amplifies the column selection line signal CSL received from the CSL driver 540, the first read pulse signal FRP received from the FRP generation circuit 530, and a second read pulse signal SRP received from the SRP generation circuit 560 and outputs amplified signals CSL, FRP, and SRP.

That is, when information of CL-=3 is input in response to a command issued by the MRS device of a memory, the clock buffer 500 generates the second clock signal PCLK_F and controls the column selection line signal CSL and the first read pulse signal FRP to synchronize with the falling edges of the second clock signal PCLK_F.

The SRP generation circuit 560 generates and outputs the second read pulse signal SRP, which is activated in synchronized with the external clock signal CLK having a predetermined delay depending on the CL information.

Figure 6:
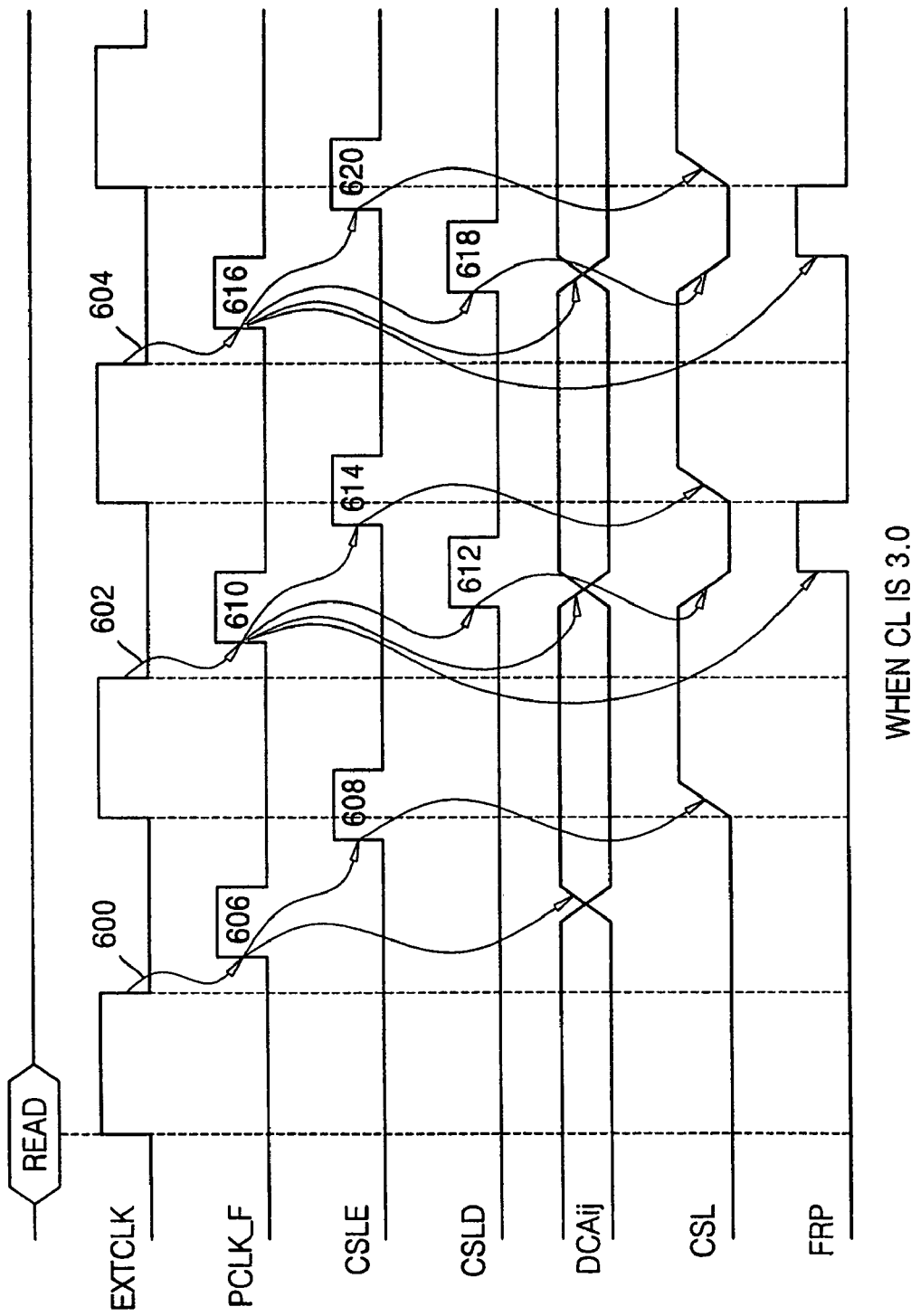
FIG. 6 is a signal timing diagram illustrating the signal controlling method according to an embodiment of the present invention when a CL is 3.

FIG. 6 is a signal timing diagram illustrating the signal controlling method according to an embodiment of the present invention when a CL is 3. Since a signal timing in the DDR SDRAM according to an embodiment of the present invention when the CL is 2 or 2.5 is the same as in a conventional DDR SDRAM, they will, not be shown.

Referring to FIGS. 5 and 6, when information of CL=3 is input to the clock buffer 500, a second clock signal PCLK_F, which synchronizes with falling edges 600, 602, and 604 of clock pulses of an external clock EXTCLK, is produced and output. When a first pulse 606 of the second clock signal PCLK_F is produced in synchronization with the falling edge 600 of a clock pulse, a CSL enabling pulse signal CSLE and a decoding address DCAij synchronize with the first pulse 60. A column selection line signal CSL is enabled in synchronization with a first pulse 608 of the CSL enable pulse signal CSLE.

Then, a second pulse 610 of the second clock signal PCLK_F is produced in synchronization with the falling edge 602, which is one clock pulse behind the falling edge 600. A pulse 612 of the CSL disable pulse signal CSLD, a pulse 614 of the CSL enable pulse signal CSLE, a decoding address DCAij, and a first pulse of a first read pulse signal FRP are produced in synchronization with the second pulse 610 of the second clock signal PCLK_F. Consequently, these signals are synchronized with the falling edges of the external clock signal EXCLK. The column selection line signal CSL is disabled in synchronization with the pulse 612 of the CSL disable pulse signal CSLD and then enabled in synchronization with the pulse 614 of the CSL enable pulse signal CSLE, which is temporally behind the pulse 612 of the CSL disable pulse signal CSLD.

Thereafter, a third pulse 616 of the second clock signal PCLK_F is produced in synchronization with the falling edge 604, which is one clock pulse behind the falling edge 602. A pulse 618 of the CSL disable pulse signal CSLD, a pulse 620 of the CSL enable pulse signal CSLE, a decoding address DCAij, and a second pulse of the first read pulse signal FRP are produced in synchronization with the third pulse 616 of the second clock signal PCLK_F. The column selection line signal CSL is disabled in synchronization with the pulse 618 of the CSL disable pulse signal CSLD and then enabled in synchronization with the pulse 620 of the CSL enable pulse signal CSLE, which is temporally behind the pulse 618 of the CSL disable pulse signal CSLD.

The semiconductor memory device according to an embodiment of the present invention can further increase the margin tRCD when the CL is 3 than when the CL is 2.5 while using a conventional method to design the margin tAA.

Also, in the semiconductor memory device according to an embodiment of the present invention, the signals CSL, FRP, and SRP are controlled in synchronization with the clocks of the external clock signal EXCLK when the CL is 3 independently of when the CL is 2.5.

Further, the interval (margin) between a pulse of the signal SRP and a pulse next to the pulse of the signal FRP corresponding to the pulse of the signal SRP can be changed to secure a margin between the signal SRP, which is controlled by a DLL, and the signal FRP, which is controlled in synchronization with the external clock signal EXCLK.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of controlling timing of a semiconductor memory device, the method comprising:
   receiving an external clock signal and information about a column address strobe (CAS) latency; and
   controlling a column selection line signal for controlling a column selection line in synchronization with one of rising and falling edges of the external clock signal depending on the type of CAS latency information.

2. The method of claim 1, further comprising outputting a first read pulse signal which synchronizes with one of a rising edge and a falling edge of the external clock signal depending on the type of CAS latency information.

3. The method of claim 1, wherein the controlling of the column selection line signal comprises:
   outputting one of a first clock signal which synchronizes with rising edges of the external clock signal and a second clock signal which synchronizes with falling edges of the external clock signal depending on the type of CAS latency information; and
   controlling the column selection line signal in response to the first and/or second clock signals.

4. The method of claim 2, wherein the controlling of the column selection line signal comprises:
   outputting one of a first clock signal which synchronizes with rising edges of the external clock signal and a second clock signal which synchronizes with falling edges of the external clock signal depending on the type of CAS latency information; and
   controlling a first read pulse signal in response to the first and/or second clock signals.

5. The method of claim 1, wherein first and second edges of the external clock signal have a phase difference of half a clock cycle.

* * * * *